United States Patent
Hong

(10) Patent No.: US 9,812,442 B2
(45) Date of Patent: Nov. 7, 2017

(54) INTEGRATED SEMICONDUCTOR DEVICE AND MANUFACTURING METHOD THEREFOR

(75) Inventor: Zhongshan Hong, Beijing (CN)

(73) Assignee: SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 741 days.

(21) Appl. No.: 13/418,339

(22) Filed: Mar. 12, 2012

(65) Prior Publication Data

US 2013/0146989 A1    Jun. 13, 2013

(30) Foreign Application Priority Data

Dec. 12, 2011   (CN) .......................... 2011 1 0410241

(51) Int. Cl.
| | |
|---|---|
| H01L 27/06 | (2006.01) |
| H01L 27/08 | (2006.01) |
| H01L 49/02 | (2006.01) |
| H01L 21/283 | (2006.01) |

(52) U.S. Cl.
CPC ...... H01L 27/0629 (2013.01); H01L 27/0802 (2013.01); H01L 28/24 (2013.01)

(58) Field of Classification Search
CPC ............. H01L 27/0802; H01L 23/5384; H01L 29/8605; H01L 21/20; H01L 21/283; H01L 21/762; H01L 27/06; H01L 27/115; H01L 27/11556; H01L 27/11582; H01L 27/1112; H01L 27/0288; H01L 28/00; H01L 29/66166; H01L 29/7304; H01L 2924/1207; H01L 2924/19043; H01L 43/08; H01L 27/0647–27/067;
(Continued)

(56) References Cited

U.S. PATENT DOCUMENTS

| | | | |
|---|---|---|---|
| 5,530,418 A | * | 6/1996 | Hsu .......................... H01L 28/20 257/E21.004 |
| 7,087,978 B1 | * | 8/2006 | Taylor ................. H01L 27/0802 257/363 |
| 7,749,822 B2 | | 7/2010 | Freeman |

(Continued)

FOREIGN PATENT DOCUMENTS

CN    1971915 A    5/2007

*Primary Examiner* — Natalia Gondarenko
(74) *Attorney, Agent, or Firm* — Innovation Counsel LLP

(57) ABSTRACT

An integrated device includes a field effect transistor formed within and upon an active region of a substrate and a resistor formed on an isolation region of the substrate. The field effect transistor includes a gate stacked structure having respective portions of a dielectric layer, a first conductive layer and a second conductive layer arranged in order from bottom to top. The resistor includes a resistor body being an enclosure portion of the first conductive layer and resistor terminals being portions of the second conductive layer on distal ends of the resistor body. A method for manufacturing a semiconductor device includes forming a gate stacked structure and a resistor stacked structure at the same time by patterning a dielectric layer, a first conductive layer and a second conductive layer. The method also includes forming a resistor having a resistor body by patterning the resistor stacked structure.

14 Claims, 6 Drawing Sheets

(58) Field of Classification Search
CPC ... H01L 28/20–28/26; H01L 27/075–27/0783;
H01L 27/101
USPC ....... 257/379, 350, 363, 380, 381, 357, 358,
257/359, E27.016, E21.19; 438/382, 210
See application file for complete search history.

(56) References Cited

U.S. PATENT DOCUMENTS

| | | |
|---|---|---|
| 2004/0175924 A1* | 9/2004 | Choi ..................... H01G 4/228 |
| | | 438/622 |
| 2007/0281418 A1 | 12/2007 | Hu et al. |
| 2008/0237800 A1* | 10/2008 | Chinthakindi et al. ....... 257/537 |
| 2009/0090977 A1* | 4/2009 | Freeman et al. ............. 257/379 |
| 2010/0181627 A1* | 7/2010 | Willmeroth ............ H01L 24/03 |
| | | 257/379 |
| 2010/0328022 A1* | 12/2010 | Fan et al. ..................... 338/309 |
| 2012/0146187 A1* | 6/2012 | Anderson et al. ............ 257/538 |
| 2012/0202334 A1* | 8/2012 | Kochergin ............ H01L 45/141 |
| | | 438/382 |
| 2012/0299115 A1* | 11/2012 | Chuang et al. ............... 257/379 |
| 2013/0032862 A1* | 2/2013 | Su ..................... H01L 27/0802 |
| | | 257/272 |

\* cited by examiner

US 9,812,442 B2

INTEGRATED SEMICONDUCTOR DEVICE AND MANUFACTURING METHOD THEREFOR

CROSS-REFERENCES TO RELATED APPLICATIONS

This application claims priority to Chinese Patent Application No. 201110410241.X, filed on Dec. 12, 2011 and entitled "Integrated Semiconductor Device and Manufacturing Method therefor", which is incorporated herein by reference in its entirety.

BACKGROUND OF THE INVENTION

Field of the Invention

This disclosure relates to an integrated semiconductor device and a manufacturing method therefor, and in particular to an integrated semiconductor device comprising a resistor and a manufacturing method therefor.

Description of the Related Art

An integrated semiconductor device usually comprises a field effect transistor.

As for a gate stacked structure of a conventional field effect transistor, a gate layer thereof generally comprises a conductive material such as polysilicon, and a gate dielectric layer thereof generally comprises a dielectric material such as silicon oxide.

As the size of a semiconductor device decreases continuously, it is a widely-adopted practice in the industry to employ a conductive material comprising a metal element (also called a metal material) to form the gate layer and employ a dielectric material with a high dielectric constant (also called a high-K dielectric material) to form the gate dielectric layer. This is the so-called high-K dielectric-metal gate (HKMG) process.

In addition to field effect transistors, the integrated semiconductor device may comprise one or more resistors.

A conventional resistor is generally formed of doped polysilicon, and usually uses a block layer to avoid reducing the resistance of the resistor due to silicidation.

U.S. Pat. No. 7,749,822 B2 discloses a method for forming a gate stacked structure of a field effect transistor in a field effect transistor region and a resistor in a resistor region. The gate stacked structure and the resistor are formed from a stacked structure of a dielectric layer, a conductive layer and a polysilicon layer. In this method, in the resistor region, the conductive layer on the dielectric layer and an un-doped polysilicon layer on a middle portion of the conductive layer serve together as a resistor body, a doped polysilicon layer on distal ends of the conductive layer serves as resistor terminals, and there are contacts electrically connected to the resistor terminals. Alternatively, the conductive layer on the dielectric layer itself serves as a resistor body, and there are contacts electrically connected to distal ends of the conductive layer. The conductive layer is, for example, a metal layer comprising titanium nitride (TiN) or tantalum carbide (TaC), and is, for example, a thin layer having a thickness of about 1 nm to about 7 nm.

However, the inventor of the present invention has realized that, in a semiconductor manufacturing process such as that in U.S. Pat. No. 7,749,822 B2, the resistance value of the resistor is usually small. This is especially true in a case where the resistor is formed of a material with high conductivity (such as a metal material). In some applications, it is desired to obtain high resistance value of a resistor.

BRIEF SUMMARY OF THE INVENTION

Embodiments of the disclosure provide a semiconductor device that includes a field effect transistor and a resistor having high resistance value and a method for manufacturing the device.

One of the objects of this disclosure is to provide an integrated semiconductor device and a manufacturing method therefor, which may increase the resistance of the resistor in a semiconductor manufacturing process as compared with the prior art.

According to one aspect of this disclosure, an integrated semiconductor device includes a field effect transistor formed within and upon an active region of a semiconductor substrate and a resistor formed on an isolation region of the semiconductor substrate, wherein the field effect transistor comprises a gate stacked structure having respective portions of a dielectric layer, a first conductive layer and a second conductive layer that are sequentially stacked on the semiconductor substrate, the dielectric layer being on the semiconductor substrate and the first conductive layer being sandwiched between the dielectric layer and the second conductive layer; and wherein the resistor comprises a resistor body being an enclosure portion of the first conductive layer and resistor terminals being portions of the second conductive layer on distal ends of the resistor body.

In an embodiment, the first conductive layer comprises a metal element.

In an embodiment, the first conductive layer comprises a material selected from the group consisting of Ti, Ta, TiN, TiAl, TaC and TaN.

In an embodiment, the first conductive layer has a thickness in the range from about 10 Å to about 100 Å.

In an embodiment, the enclosure portion has a width in the range from about 1 nm to about 10 nm.

In an embodiment, the first conductive layer comprises a plurality of conductive sub-layers.

In an embodiment, the second conductive layer comprises a material selected from the group consisting of polysilicon, Al, W and Ag.

In an embodiment, the dielectric layer comprises a high-K dielectric material.

In an embodiment, the high-K dielectric material comprises hahnium.

In an embodiment, the high-K dielectric material is selected from the group consisting of $HfO_2$, HfSiO, HfSiON and $HfZrO_4$.

In an embodiment, the integrated semiconductor device further comprises a contact electrically connected to the field effect transistor and contacts electrically connected to the resistor terminals.

In an embodiment, the contact electrically connected to the field effect transistor and one of the contacts electrically connected to the resistor terminals are electrically connected to each other.

According to another aspect of this disclosure, a method for manufacturing an integrated semiconductor device includes forming a dielectric layer on a semiconductor substrate, a first conductive layer on the dielectric layer and a second conductive layer on the first conductive layer; forming a gate stacked structure of a field effect transistor on an active region of the semiconductor substrate and a resistor stacked structure on an isolation region of the semiconductor substrate by performing a first patterning process on the dielectric layer, the first conductive layer and the second conductive layer; forming a first sidewall spacer on sidewalls of the gate stacked structure and on sidewalls of the resistor stacked structure; removing a portion of the second conductive layer of the resistor stacked structure between its distal ends by a second patterning process to form an opening having sidewalls; forming a second sidewall spacer on the sidewalls of the opening; and removing a portion of the first conductive layer of the resistor stacked structure using the second sidewall spacer as a mask to form an enclosure portion of the first conductive layer of the resistor stacked structure.

In an embodiment, the first conductive layer comprises a metal element.

In an embodiment, the first conductive layer comprises a material selected from the group consisting of Ti, Ta, TiN, TiAl, TaC and TaN.

In an embodiment, the first conductive layer has a thickness in the range from about 10 Å to about 100 Å.

In an embodiment, the enclosure portion has a width in the range from about 1 nm to about 10 nm.

In an embodiment, the first conductive layer comprises a plurality of conductive sub-layers.

In an embodiment, the second conductive layer comprises a material selected from the group consisting of polysilicon, Al, W and Ag.

In an embodiment, the dielectric layer comprises a high-K dielectric material.

In an embodiment, the high-K dielectric material comprises hahnium.

In an embodiment, the high-K dielectric material is selected from the group consisting of $HfO_2$, HfSiO, HfSiON and $HfZrO_4$.

In an embodiment, the method further comprises: removing the second sidewall spacer after forming the enclosure portion; forming an interlayer dielectric layer on the semiconductor substrate; and forming a contact that is electrically connected to the field effect transistor and contacts that are electrically connected to the distal ends of the second conductive layer of the resistor stacked structure in the interlayer dielectric layer.

In an embodiment, the method further comprises: electrically connecting the contact that is electrically connected to the field effect transistor with one of the contacts that are electrically connected to the distal ends of the second conductive layer of the resistor stacked structure.

One of the advantages of the integrated semiconductor device and the manufacturing method therefor of this disclosure is that the resistance value of the resistor may be increased in a semiconductor manufacturing process as compared with the prior art.

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is to be noted that, in the accompanying drawings, for convenience of description, the sizes of respective components may not be drawn based on actual scales. Also, the same or similar reference signs represent the same or similar components in the accompanying drawings.

Figure 1A:
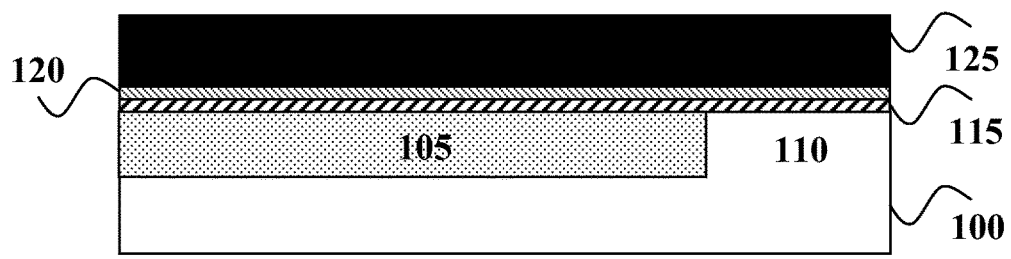
FIGS. 1A through 1H are sectional views schematically illustrating stages of a method of manufacturing an integrated semiconductor device according to an embodiment of this disclosure.

The objects, features and advantages of this disclosure will become apparent from the following detailed description of exemplary embodiments with reference to the accompanying drawings.

DETAILED DESCRIPTION OF THE INVENTION

This disclosure will be described below with reference to the accompanying drawings. It shall be noted that the following description is merely illustrative and exemplary in nature, and is in no way intended to limit this disclosure and its applications or uses. The relative arrangement of components and steps, numerical expressions and numerical values set forth in the embodiments do not limit the scope of this disclosure unless it is otherwise specifically stated. In addition, techniques, methods and devices known by persons skilled in the art may not be discussed in detail, but are intended to be a part of the specification where appropriate.

According to this disclosure, a gate stacked structure of a field effect transistor is formed on an active region of a semiconductor substrate and a resistor stacked structure is formed on an isolation region of the semiconductor substrate. In an embodiment, the gate stacked structure and the resistor stacked structure are formed at the same time from a stacked structure of a dielectric layer, a first conductive layer and a second conductive layer using a patterning and etching process. In other words, the gate stacked structure and the resistor stacked structure have the same number of layers, each having a same thickness. In an embodiment, the resistor comprises a resistor body which is formed by an enclosure portion of the first conductive layer. Since the enclosure portion of the first conductive layer is used as the resistor body in an embodiment, the cross-sectional area of the resistor body available for the current flow (i.e., area perpendicular to the current flow direction) is reduced. The reduced cross section increases the resistance of the resistor as compared with the prior art, especially in a case where the first conductive layer has high conductivity (for example, the first conductive layer may comprise a metal element, or the first conductive layer is a metal layer). In addition, as will be understood from the following description, in this disclosure, since the width of the enclosure portion of the first conductive layer may be controlled by controlling the thickness of a spacer, the width of the enclosure portion of the first conductive layer may be made narrower, which further increases the resistance of the resistor.

Exemplary embodiments of this disclosure will be described in detail below with reference to FIGS. 1A through 1I and FIG. 2, wherein FIGS. 1A through 1H show schematically cross-sectional views after respective steps of a method of manufacturing an integrated semiconductor device according to an embodiment of this disclosure. FIG. 1I is a schematic plan view of a resistor after manufacturing stages shown in FIGS. 1F through 1H in accordance with embodiments of this disclosure.

Figure 1B:
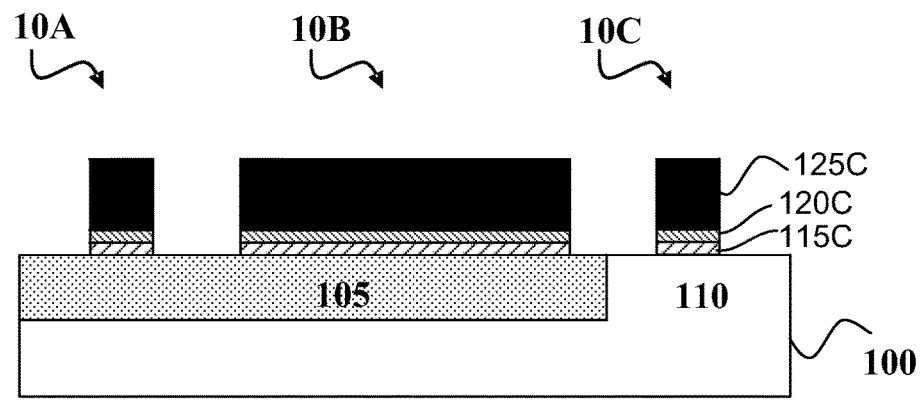
Figure 1C:
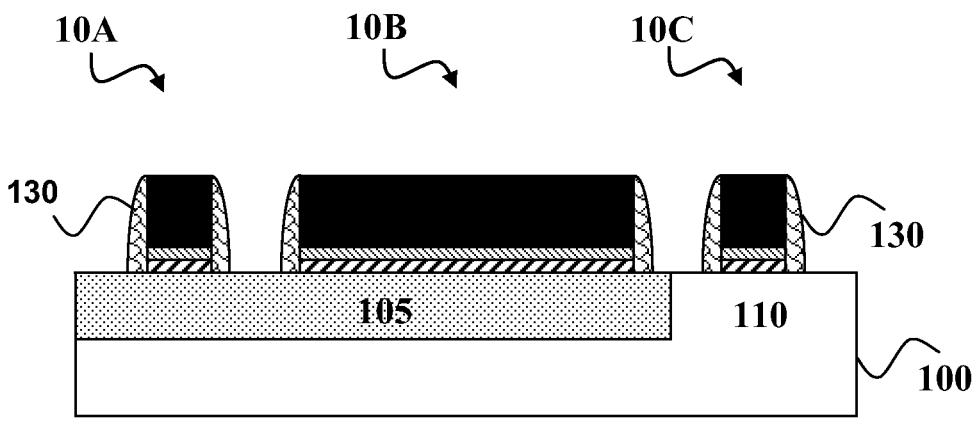
Figure 1D:
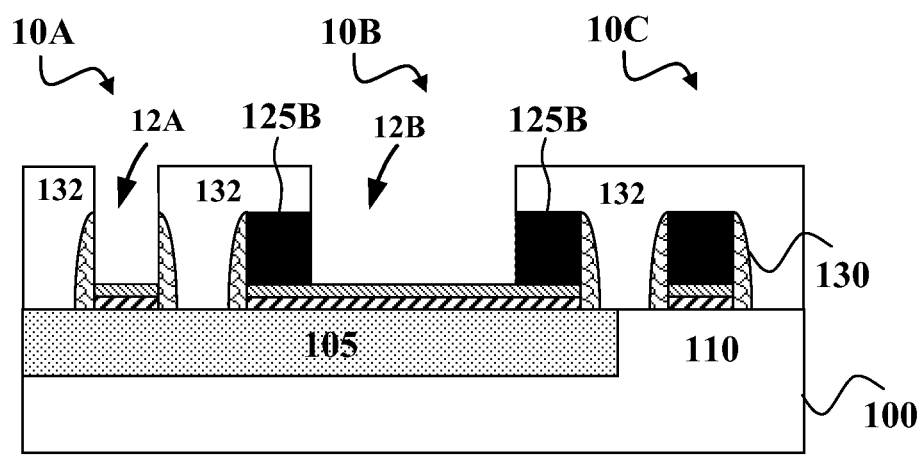
Figure 1E:
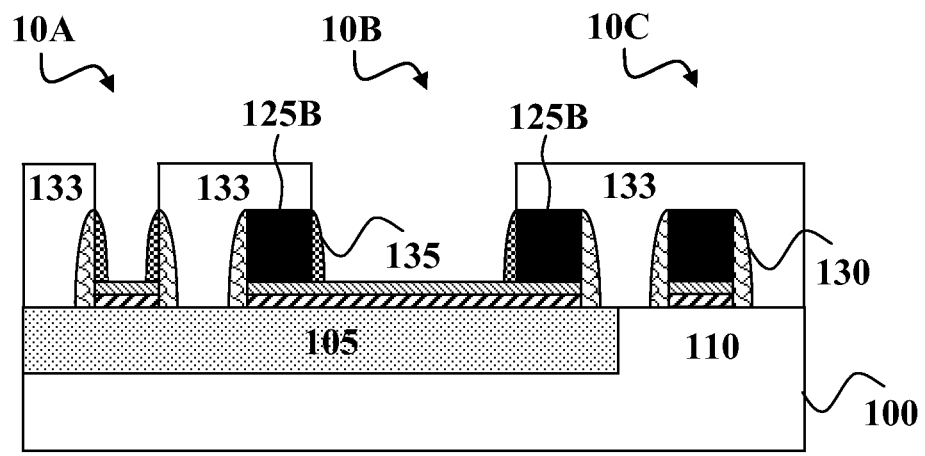
Figure 1F:
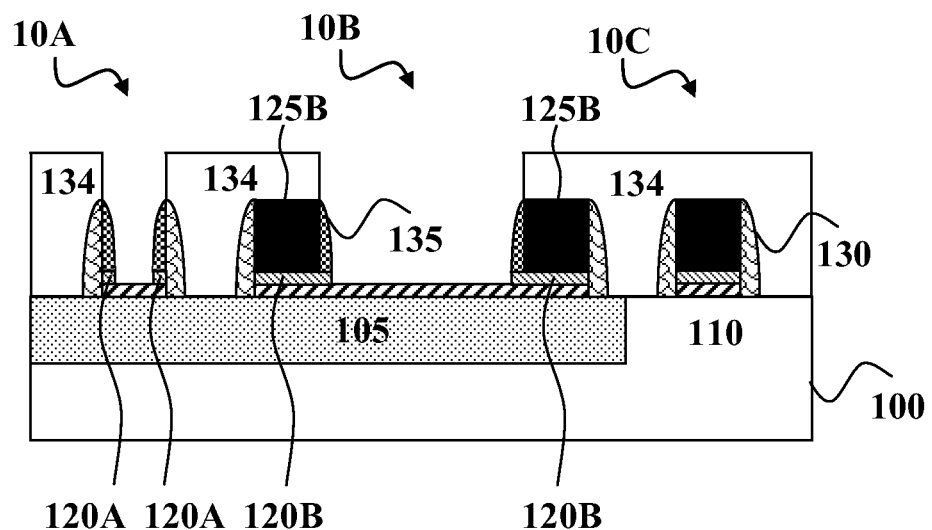
Figure 1G:
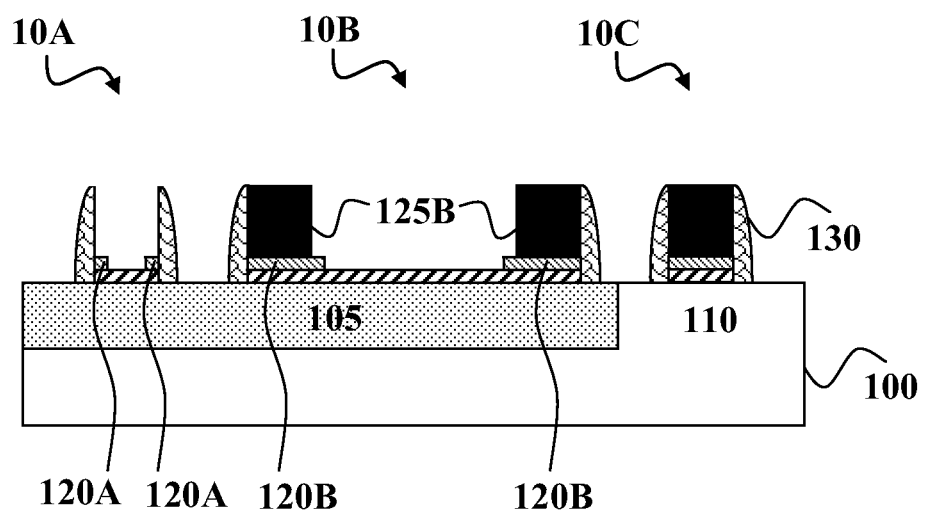
Figure 1H:
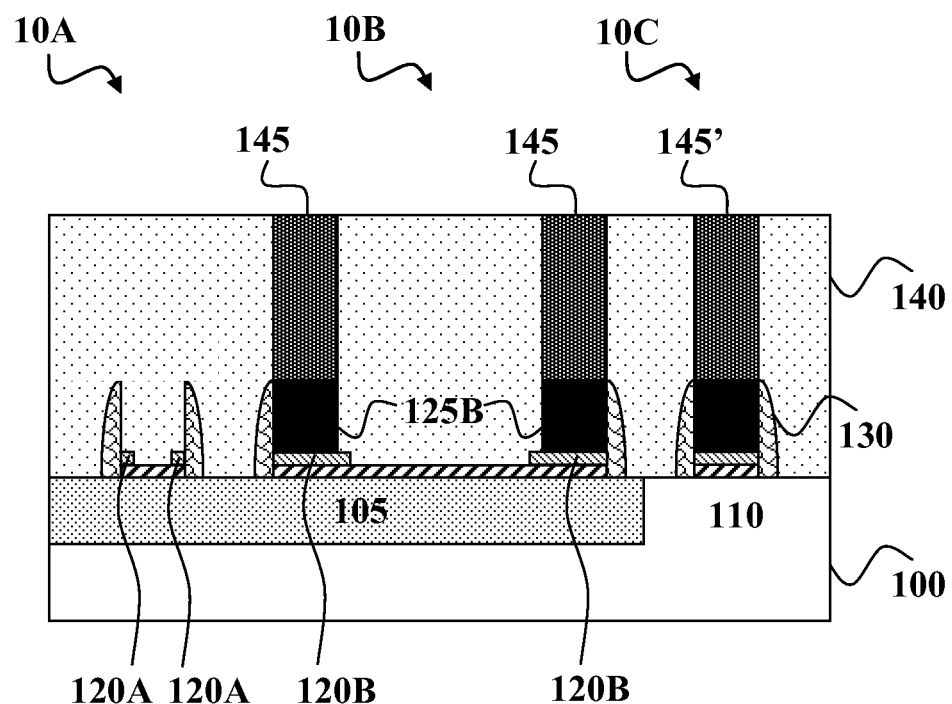
Figure 2:
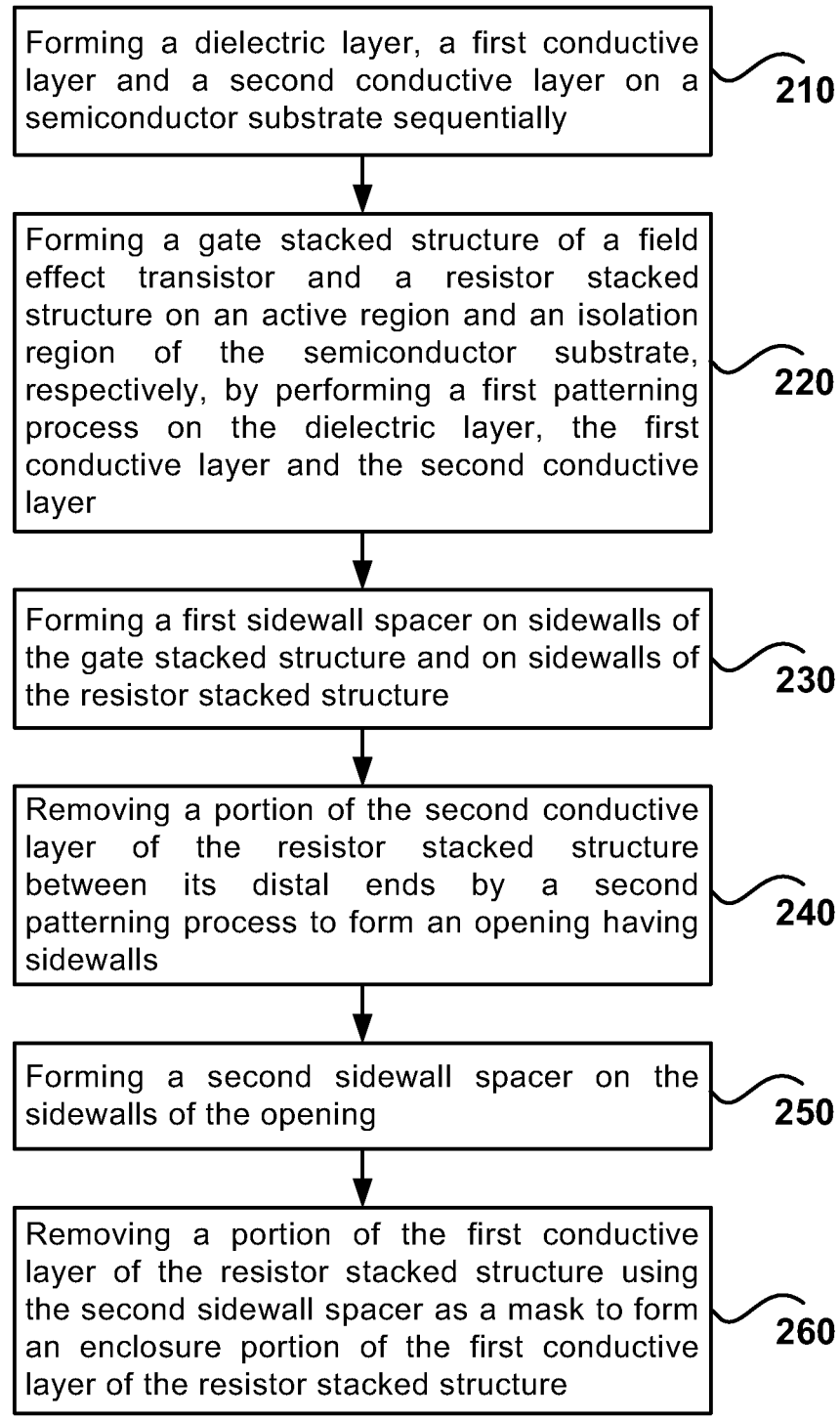
FIG. 2 is a flowchart of a method of manufacturing an integrated semiconductor device according to an embodiment of this disclosure.

FIG. 2 is a flowchart of a method of manufacturing an integrated semiconductor device according to an embodiment of this disclosure. FIG. 2 should be considered in conjunction with FIGS. 1A through 1H.

Referring to manufacturing step 210 of FIG. 2, a dielectric layer 115, a first conductive layer 120 and a second conductive layer 125 are formed on a semiconductor substrate 100 sequentially (see FIG. 1A).

The semiconductor substrate 100 is not limited to a particular substrate type, and it may be, for example, a silicon (Si) substrate, a silicon-on-insulator (SOI) substrate or any other suitable substrate. An isolation region 105 such as shallow trench isolation (STI) may be formed in the semiconductor substrate 100 by any suitable process known in the art, and an active region 110 may be interposed between two isolation regions 105.

A stacked structure of the dielectric layer 115, the first conductive layer 120 and the second conductive layer 125 arranged in order from bottom to top may be formed on the semiconductor substrate 100 by any suitable process known in the art.

The dielectric layer 115 is not limited to a particular material. In an embodiment, the dielectric layer may comprise silicon oxide, silicon nitride or silicon oxynitride. In an alternative embodiment, the dielectric layer 115 may comprise a high-K dielectric material, e.g., in a HKMG process. The high-K dielectric material may comprise hahnium, in an example embodiment. In a specific embodiment, the high-K dielectric material may be selected from the group consisting of hafnium oxide ($HfO_2$), hafnium silicate (HfSiO), hafnium silicon oxynitride (HfSiON) and hafnium zirconate ($HfZrO_4$), but is not limited thereto.

The first conductive layer 120 is not limited to a particular material. For example, in the HKMG process, the first conductive layer 120 may comprise a metal element (i.e., may be a metal layer). In a specific embodiment, the first conductive layer 120 may comprise a material selected from Ti, Ta, TiN, TiAl, TaC and TaN, but is not limited thereto. The thickness of the first conductive layer 120 may be, in an example embodiment, in the range from about 10 Å to about 100 Å, but it may also take any other suitable value. Incidentally, the first conductive layer 120 may be either of a single-layered structure and a multi-layered structure comprising a plurality of conductive sub-layers, and the material of the conductive sub-layers may be, for example, selected from the above-mentioned materials. Persons skilled in the art may choose the material, thickness, structure and the like of the first conductive layer 120 according to actual design requirements.

The second conductive layer 125 is not limited to a particular material. The second conductive layer 125 may comprise polysilicon, for example. The polysilicon may be doped polysilicon for example, and persons skilled in the art may employ any suitable doping concentration and doping type according to actual needs. Alternatively, the second conductive layer 125 may comprise a metal element. More specifically, the second conductive layer 125 may comprise a material selected from the group consisting of Al, W and Ag, but is not limited thereto.

Next, in step 220 of FIG. 2, a gate stacked structure 10C of a field effect transistor is formed on the active region 110 and resistor stacked structures 10A and 10B are formed on the isolation region 105 of the semiconductor substrate 100 by performing a first patterning process on the dielectric layer 115, the first conductive layer 120 and the second conductive layer 125 (see FIG. 1B).

The first patterning process may be performed by any suitable process in the art. The obtained gate stacked structure 10C is formed by respective portions of the dielectric layer 115, the first conductive layer 120 and the second conductive layer 125 arranged in order from bottom to top. That is, the gate stacked structure has a portion 115C of the dielectric layer on the active region, a portion 120C of the first conductive layer on the portion 115C, and a portion 125C of the second conductive layer on the portion 120C. Likewise, the obtained resistor stacked structures 10A and 10B are also formed by respective portions of the dielectric layer 115, the first conductive layer 120 and the second conductive layer 125 arranged in order from bottom to top, respectively. In an embodiment, resistor stacked structures 10A and 10B are formed at the same time as the formation of the gate stacked structure 10C. In an embodiment, the resistor stacked structures and the gate stacked structure have the same number of layers, and each layer has the same thickness. As an example, two resistor stacked structures 10A and 10B are shown in FIG. 1B, wherein the resistor stacked structure 10A extends in a direction perpendicular to the drawing plane, and the resistor stacked structure 10B extends in a horizontal direction in the drawing plane. The purpose of showing the two resistor stacked structures 10A and 10B as described above is to clearly show two sections perpendicular to each other of the resistor stacked structures. It readily occurs to persons skilled in the art that the number of the formed resistor stacked structures can be any number and is not limited to two.

Then, in step 230 of FIG. 2, a first sidewall spacer 130 is formed on sidewalls of the gate stacked structure 10C and on sidewalls of the resistor stacked structures 10A and 10B (see FIG. 1C).

The first sidewall spacer 130 may be formed by any suitable process in the art. Moreover, the first sidewall spacer 130 is not limited to a particular material, and it may be, for example, silicon oxide, silicon nitride or silicon oxynitride.

In addition, after forming the first sidewall spacer 130, persons skilled in the art may also perform various processes according to actual needs, such as forming a source region and a drain region in the active region 110 by ion implantation (not shown in the drawing).

Next, in step 240 of FIG. 2, portions of the second conductive layers of the resistor stacked structures 10A and 10B between their distal ends are removed by a second patterning process to form respective openings 12A, 12B having sidewalls. The openings expose surface regions of the first conductive layers of the resistor stacked structures 10A and 10B (see FIG. 1D).

Likewise, the second patterning process may be performed by any suitable process in the art. During step 240, for example, the gate stacked structure 10C and the like may be masked by a photoresist 132 so as not to be affected. After step 240, only the distal ends of the second conductive layers remain in the resistor stacked structures 10A and 10B, while the portions between the distal ends of the second conductive layers are removed. As will be understood from the following description, the distal ends of the second conductive layers will serve as resistor terminals. Here, it is to be noted that, although the distal ends 125B of the second conductive layer of the resistor stacked structure 10B extending in the horizontal direction in the drawing plane are shown in FIG. 1D, as for the second conductive layer of the resistor stacked structure 10A extending in a direction perpendicular to the figure plane, the distal ends thereof 125A are not shown in FIG. 1D since they are not in the figure plane.

Then, in step 250 of FIG. 2, a second sidewall spacer 135 is formed on the sidewalls of the openings (see FIG. 1E).

Likewise, the second sidewall spacer 135 may be formed by any suitable process in the art. Likewise, during step 250, for example, the gate stacked structure 10C and the like may be masked by a photoresist 133 so as not to be affected.

Incidentally, the photoresist 132 in step 240 and the photoresist 133 in step 250 may be, for example, the same photoresist, but this disclosure is not limited thereto. In an embodiment, the material of the second sidewall spacer 135 may be polymer, silicon oxide, silicon nitride, silicon oxynitride or any other suitable material. Moreover, although the second sidewall spacer 135 shown in FIG. 1E has a single-layered structure, it may also be of a multi-layered structure comprising a plurality of sub-layers. In an example embodiment, the second sidewall spacer 135 may comprise a polymer sub-spacer and a silicon oxide or silicon nitride sub-spacer on the polymer sub-spacer.

As shown in FIG. 1E, the second sidewall spacer 135 covers the sidewalls of the openings and thus forms a surrounding enclosure. As will be understood from the following description, the surrounding enclosure of the second sidewall spacer 135 may be used as a mask for forming an enclosure portion of the first conductive layer. The enclosure portion of the first conductive layer serves as the resistor body, and the width of the enclosure portion of the first conductive layer serving as the resistor body depends on the thickness of the second sidewall spacer 135. Incidentally, the thickness of the second sidewall spacer 135 refers to, for example, its size along the horizontal direction in FIG. 1E, and this thickness is denoted as "W" in FIG. 1I that will be described later. Accordingly, in this disclosure, the width of the enclosure portion of the first conductive layer serving as the resistor body may be made narrower to increase the resistance of the resistor. Furthermore, the width of the enclosure portion of the first conductive layer serving as the resistor body may also be controlled by controlling the thickness of the second sidewall spacer 135 according to design specifications, thereby the resistance of the resistor can be controlled with accuracy.

Figure 1I:
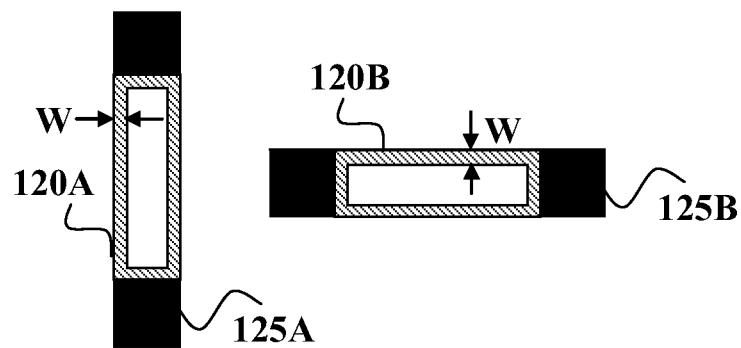
FIG. 1I is a schematic plan view of a resistor after performing process steps shown in FIGS. 1F through 1H.

Next, in step 260 of FIG. 2, exposed portions of the first conductive layers of the resistor stacked structures 10A and 10B are removed using the second sidewall spacer 135 as a mask to form enclosure portions 120A and 120B of the first conductive layers of the resistor stacked structures 10A and 10B (see FIGS. 1F and 1I).

Step 260 may be performed by any suitable process in the art. Likewise, during step 260, for example, the gate stacked structure 10C and the like may be masked by a photoresist 134 so as not to be affected. Incidentally, the photoresist 132 in step 240, the photoresist 133 in step 250 and the photoresist 134 in step 260 may be, for example, the same photoresist, but this disclosure is not limited thereto. After step 260, the gate stacked structure 10C almost remains unchanged, i.e., it is still formed by respective portions of the dielectric layer 115, the first conductive layer 120 and the second conductive layer 125 arranged in order from bottom to top; whereas the resistor stacked structures 10A and 10B are formed into resistors. More specifically, as clearly shown in FIGS. 1F and 1I, the resistors comprise resistor bodies formed by the enclosure portions 120A and 120B of the first conductive layers, and also comprise resistor terminals formed by the distal ends 125A and 125B of the second conductive layers (i.e., portions of the second conductive layers on the distal ends of the resistor bodies). Incidentally, although the dielectric layers of the resistor stacked structures 10A and 10B are also shown in FIG. 1F, the dielectric layers are not necessary to the resistors. In other words, the resistors may comprise the dielectric layers or may not comprise the dielectric layers.

As described above, in this disclosure, the resistor body is formed by the enclosure portion 120A, 120B of the first conductive layer. Therefore, as compared with the prior art which does not employ an enclosure structure of the resistor, the cross-sectional area of the resistor perpendicular to the current flow direction of this disclosure is reduced, thereby the resistance of the resistor is increased. This is especially useful in a case where the first conductive layer has high conductivity (for example, being a metal layer).

In addition, as described above, the width W (see FIG. 1I) of the enclosure portion 120A, 120B of the first conductive layer serving as the resistor body depends on the thickness of the second sidewall spacer 135. In an example embodiment, the width W of the enclosure portion 120A, 120B is in the range from about 1 nm to about 10 nm, but is not limited thereto. Therefore, in this disclosure, the width W of the enclosure portion 120A, 120B of the first conductive layer serving as the resistor body may be made narrower to increase the resistance value of the resistor. Furthermore, the width W of the enclosure portion 120A, 120B of the first conductive layer serving as the resistor body may also be controlled flexibly by controlling the thickness of the second sidewall spacer 135 according to actual needs, thereby the resistance of the resistor is controlled flexibly.

According to embodiments of this disclosure, the gate stacked structure 10C of the field effect transistor and the resistor stacked structures 10A and 10B are formed on the active region 110 and the isolation region 105 of the semiconductor substrate 100, respectively. The gate stacked structure and the resistor stacked structures are formed at the same time from the stacked structure of the dielectric layer 115, the first conductive layer 120 and the second conductive layer 125. Therefore, embodiments of this disclosure may reduce process steps and reduce manufacturing cost.

In an embodiment, the second sidewall spacer 135 may be removed by any suitable process in the art after forming the enclosure portions 120A and 120B (see FIG. 1G).

In addition, in an embodiment, an interlayer dielectric layer 140 may be further formed on the semiconductor substrate 100, and a contact 145' electrically connected to the field effect transistor and contacts 145 electrically connected to the distal ends 125B of the second conductive layers of the resistor stacked structures 10A and 10B may be formed in the interlayer dielectric layer 140, respectively (see FIG. 1H). It is to be noted that, the contacts 145 and 145' are shown schematically as three vertical conducting plugs, and persons skilled in the art may also form contacts of other forms according to actual needs. As an example, the contact 145' may be electrically connected to the source and/or the drain of the field effect transistor, or may be electrically connected to the gate of the field effect transistor.

In an embodiment, the contact 145' electrically connected to the field effect transistor and one of the contacts 145 electrically connected to the distal ends 125B of the second conductive layers of the resistor stacked structures 10A and 10B may further be electrically connected to each other through a conducting wire overlying the interlayer dielectric layer 140 (not shown in FIG. 1H).

According to the method of this disclosure as described above, an integrated semiconductor device may be formed. The integrated semiconductor device comprises: a field effect transistor formed at an active region 110 of a semiconductor substrate 100; and a resistor formed on an isolation region 105 of the semiconductor substrate 100, wherein the field effect transistor comprises a gate stacked structure 10C having respective portions of a dielectric layer, a first conductive layer and a second conductive layer that are sequentially stacked on the semiconductor substrate, the dielectric layer being on the semiconductor substrate and the first conductive layer being sandwiched between the dielectric layer and the second conductive layer; and wherein the resistor comprises a resistor body being an enclosure portion 120A, 120B of the first conductive layer and resistor terminals being portions 125B of the second conductive layer on distal ends of the resistor body.

In an embodiment, the integrated semiconductor device further comprises a contact 145' electrically connected to the field effect transistor and contacts 145 electrically connected to the resistor terminals.

In addition, in an embodiment, the contact 145' electrically connected to the field effect transistor and one of the contacts 145 electrically connected to the resistor terminals are electrically connected to each other.

According to the above teaching, it readily occurs to persons skilled in the art that the integrated semiconductor device and the manufacturing method therefor of this disclosure may achieve technical effects such as increasing the resistance of the resistor in a semiconductor manufacturing process as compared with the prior art.

By now, the integrated semiconductor device and the manufacturing method therefor according to this disclosure have been described in detail. Some details well known in the art are not described in order to avoid obscuring the concept of this disclosure. Persons skilled in the art may thoroughly understand how to implement the technical solutions disclosed herein according to the above description.

While this disclosure has been described with reference to exemplary embodiments, it shall be understood that this disclosure is not limited to the disclosed exemplary embodiments. It is obvious to persons skilled in the art that the above exemplary embodiments may be modified without deviating from the scope and spirit of this disclosure. The scope of the appended claims shall be accorded with the broadest interpretation so as to encompass all such modifications and equivalent structures and functions.

What is claimed is:

1. An integrated semiconductor device comprising:
   a field effect transistor formed within and on an active region of a semiconductor substrate;
   a resistor formed on an isolation region of the semiconductor substrate; and
   an interlayer dielectric layer,
   wherein the field effect transistor comprises a gate stacked structure having respective portions of a dielectric layer, a first conductive layer and a second conductive layer that are sequentially stacked on the semiconductor substrate, the dielectric layer being on the semiconductor substrate and the first conductive layer being sandwiched between the dielectric layer and the second conductive layer;
   wherein the resistor comprises a resistor body being an enclosure portion of the first conductive layer entirely on the dielectric layer and resistor terminals being portions of the second conductive layer on distal ends of the resistor body, wherein the enclosure portion comprises two linear segments extending between the distal ends of the resistor body, a resistance of the resistor body defining a resistance value of the resistor; and
   wherein the interlayer dielectric layer extends between the resistor terminals and into an opening in the enclosure portion to directly contact a portion of the dielectric layer through the opening in the enclosure portion, the interlayer dielectric layer direct contacting the enclosure portion, the opening in the enclosure portion being entirely surrounded by and between the two linear segments and the distal ends of the resistor body, inner and outer perimeters of the enclosure portion formed by the first conducitve layer being continuous in a plan view, the outer perimeter of the enclosure portion being co-aligned with an outer perimeter of the resistor terminals.

2. The integrated semiconductor device of claim 1, wherein the first conductive layer comprises a metal element.

3. The integrated semiconductor device of claim 1, wherein the first conductive layer comprises a material selected from Ti, Ta, TiN, TiAl, TaC and TaN.

4. The integrated semiconductor device of claim 1, wherein the first conductive layer has a thickness in a range from about 10 Å to about 100 Å.

5. The integrated semiconductor device of claim 1, wherein the enclosure portion has a width in a range from about 1 nm to about 10 nm.

6. The integrated semiconductor device of claim 1, wherein the first conductive layer comprises a plurality of conductive sub-layers.

7. The integrated semiconductor device of claim 1, wherein the second conductive layer comprises a material selected from polysilicon, Al, W and Ag.

8. The integrated semiconductor device of claim 1, wherein the dielectric layer comprises a high-K dielectric material.

9. The integrated semiconductor device of claim 8, wherein the high-K dielectric material comprises hafnium.

10. The integrated semiconductor device of claim 9, wherein the high-K dielectric material is selected from $HfO_2$, HfSiO, HfSiON and $HfZrO_4$.

11. The integrated semiconductor device of claim 1, further comprising a contact electrically connected to the field effect transistor and contacts electrically connected to the resistor terminals.

12. The integrated semiconductor device of claim 11, wherein the contact electrically connected to the field effect transistor and one of the contacts electrically connected to the resistor terminals are electrically connected to each other.

13. The integrated semiconductor device of claim 11 wherein the contact electrically connected to the field effect transistor and the contacts electrically connected to the resistor terminals are in the interlayer dielectric layer.

14. The integrated semiconductor device of claim 1, further comprising a first sidewall spacer directly contacting the two linear segments and the distal ends of the resistor body.

* * * * *